United States Patent
Nakamura et al.

(10) Patent No.: US 11,049,030 B2
(45) Date of Patent: Jun. 29, 2021

(54) ANALYSIS APPARATUS, ANALYSIS METHOD, AND ANALYSIS PROGRAM

(71) Applicant: NIPPON TELEGRAPH AND TELEPHONE CORPORATION, Chiyoda-ku (JP)

(72) Inventors: Yoshitaka Nakamura, Musashino (JP); Machiko Toyoda, Musashino (JP); Shotaro Tora, Musashino (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 395 days.

(21) Appl. No.: 16/080,273

(22) PCT Filed: Mar. 6, 2017

(86) PCT No.: PCT/JP2017/008815
§ 371 (c)(1),
(2) Date: Aug. 27, 2018

(87) PCT Pub. No.: WO2017/154844
PCT Pub. Date: Sep. 14, 2017

(65) Prior Publication Data
US 2019/0050747 A1    Feb. 14, 2019

(30) Foreign Application Priority Data
Mar. 7, 2016    (JP) .............................. JP2016-043618

(51) Int. Cl.
*G06N 5/04* (2006.01)
*G06F 11/07* (2006.01)
(Continued)

(52) U.S. Cl.
CPC ......... *G06N 5/048* (2013.01); *G06F 11/0775* (2013.01); *G06F 30/20* (2020.01); *G06N 20/00* (2019.01)

(58) Field of Classification Search
USPC .......................................... 706/12
See application file for complete search history.

(56) References Cited

U.S. PATENT DOCUMENTS 7,696,553 B2 * 4/2010 Nakamura .............. H01L 28/91
257/300
7,741,176 B2 * 6/2010 Uno .................. H01L 27/10852
438/255
(Continued)

FOREIGN PATENT DOCUMENTS

| JP | 2015-108898 A | 6/2015 |
| JP | 2015-164005 A | 9/2015 |

OTHER PUBLICATIONS

International Search Report dated May 23, 2017, in PCT/JP2017/008815 filed Mar. 6, 2017.
(Continued)

*Primary Examiner* — Michael B Holmes
(74) *Attorney, Agent, or Firm* — Oblon, McClelland, Maier & Neustadt, L.L.P.

(57) ABSTRACT

A text log feature vector generator generates a text log feature vector on the basis of a text log. A numerical log feature vector generator generates a numerical log feature vector on the basis of a numerical log. A system feature vector generator generates a system feature vector on the basis of the text log feature vector and the numerical log feature vector. A learning unit learns a plurality of appearance values of the system feature vector to generate a system state model as a model indicating a state of the system. A determination unit determines the state of the system at (Continued)

determination target time on the basis of the system feature vector at the determination target time and the system state model.

9 Claims, 6 Drawing Sheets

(51) Int. Cl.
    *G06F 30/20*     (2020.01)
    *G06N 20/00*     (2019.01)

(56) References Cited

U.S. PATENT DOCUMENTS

| | | | |
|---|---|---|---|
| 7,919,385 B2* | 4/2011 | Nakamura | H01L 27/10852 438/389 |
| 7,939,405 B2* | 5/2011 | Maekawa | H01L 27/10852 438/256 |
| 8,117,834 B2* | 2/2012 | Toshioka | F01N 9/00 60/301 |
| 8,188,529 B2* | 5/2012 | Nakamura | H01L 27/0207 257/306 |
| 8,505,283 B2* | 8/2013 | Oda | F01N 3/2066 60/295 |
| 8,957,466 B2* | 2/2015 | Nakamura | H01L 27/10817 257/306 |
| 9,203,054 B2* | 12/2015 | Hirasawa | G02B 5/1809 |
| 9,569,597 B2* | 2/2017 | Yamada | H04L 67/10 |
| RE46,882 E* | 5/2018 | Nakamura | H01L 27/0207 |
| 10,489,353 B2* | 11/2019 | Esaka | G06F 17/40 |
| RE47,988 E* | 5/2020 | Nakamura | H01L 27/0207 |
| 2018/0064397 A1* | 3/2018 | Horikawa | A61B 5/721 |
| 2020/0057906 A1* | 2/2020 | Tora | G06F 11/30 |

OTHER PUBLICATIONS

Kenji, Y., "Anomaly Detection with Data Mining", Kyoritsu Shuppan Co., 2009, 5 pages.

* cited by examiner

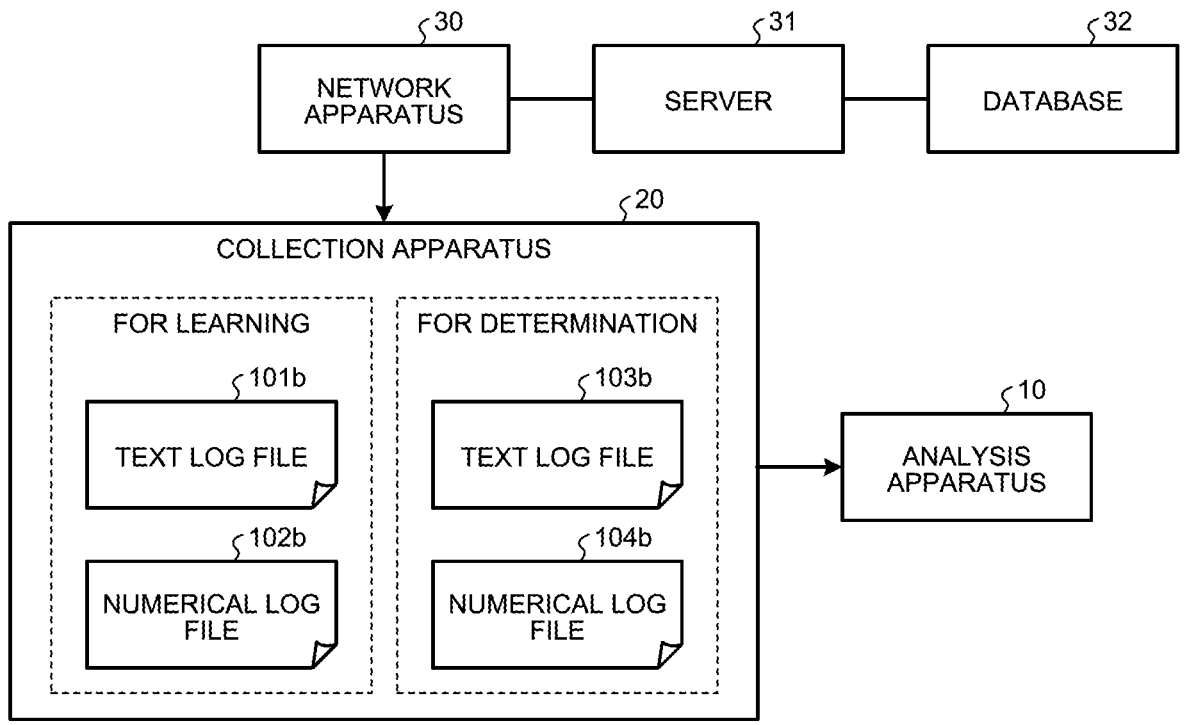
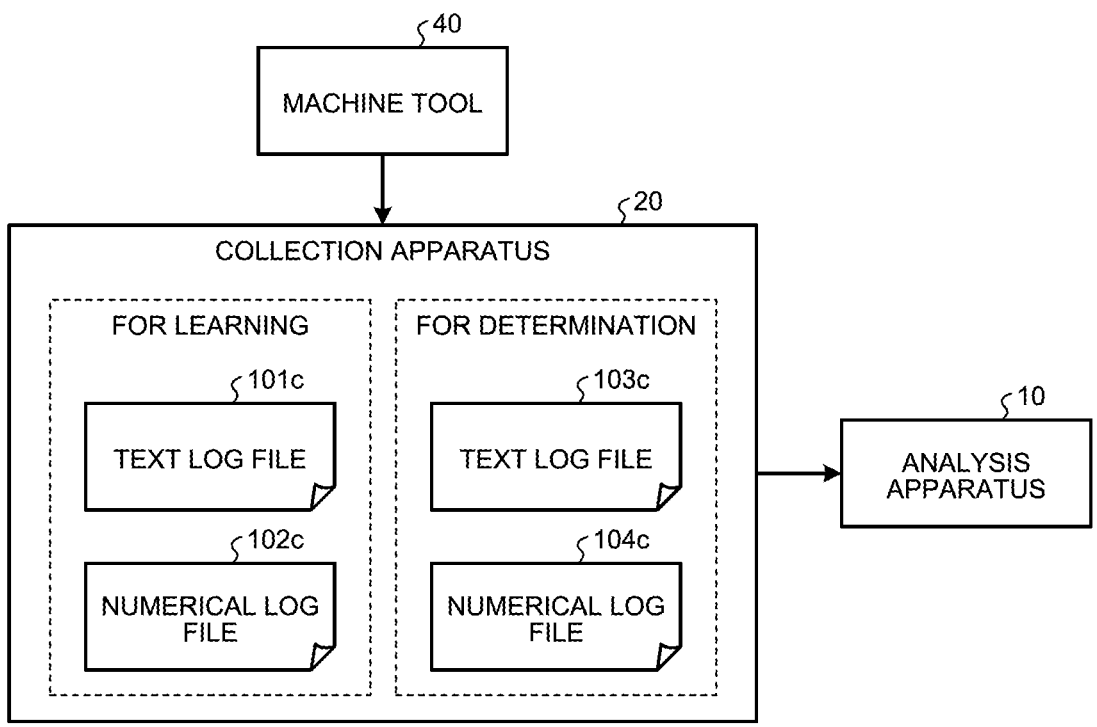

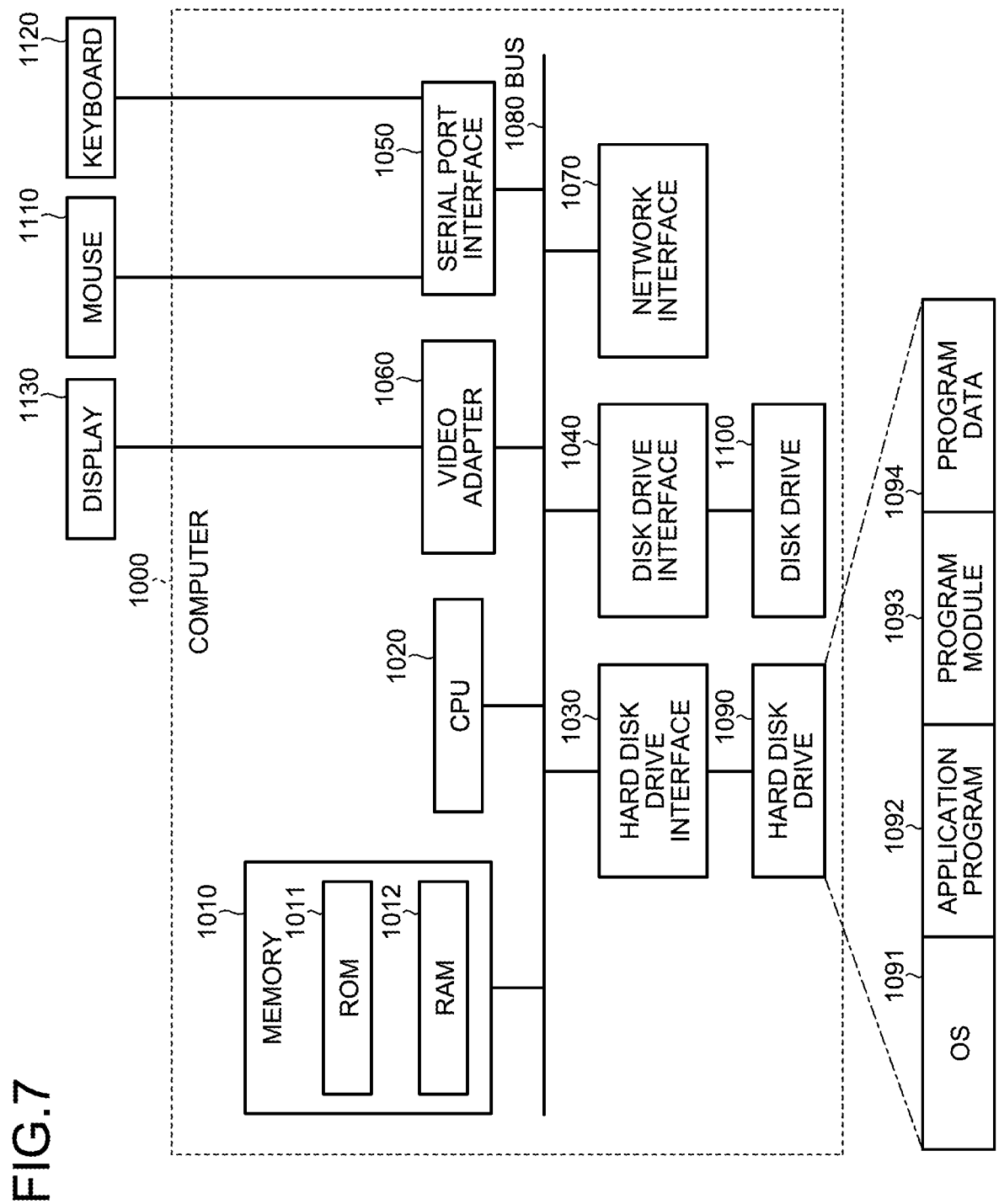

ANALYSIS APPARATUS, ANALYSIS METHOD, AND ANALYSIS PROGRAM

FIELD

The present invention relates to an analysis apparatus, an analysis method, and an analysis program.

BACKGROUND

Conventionally, system monitoring operation work using a text log such as a syslog and management information base (MIB) information is performed for anomaly detection and state analysis in a server system and a network system. To be specific, whether a specific keyword related to an anomaly is contained in the acquired text log is monitored, and contents of the text log are checked in occurrence of a failure to be used for estimation of a cause of the failure. Furthermore, system monitoring operation work by determination with a threshold using performance information or a time-series numerical log that an attached sensor or the like acquires has been also known.

Moreover, known has been a method in which when change in a log occurs in comparison with a log transition model in a normal state that is provided by clustering of text logs, performance information, that is, a numerical log is instructed to be acquired and presence of a failure is determined on the basis of the acquired performance information and text log information.

CITATION LIST

Patent Literature

Non-Patent Literature 1: Kenji YAMANISHI, "Anomaly Detection with Data Mining", KYORITSU SHUPPAN CO., 2009

SUMMARY

Technical Problem

The conventional technique, however, has the problem that a system state cannot be comprehensively analyzed on the basis of both of the text log and the numerical log.

For example, in the above-mentioned method in which the numerical log is acquired when change in the log occurs and presence of the failure is determined, the determination using the numerical log is performed only when the change occurs in the text log and the determination using the numerical log is not performed when no change occurs in the text log. Thus, with the conventional technique, the system state cannot be comprehensively analyzed on the basis of both of the text log and the numerical log when no change occurs in the text log. As a result, failure cases are missed, resulting in lowering of detection accuracy.

Solution to Problem

To solve a problem and to achieve an object, an analysis method comprises: a text log feature vector generating step of generating a first feature vector on the basis of a text log output from a system and being a log expressed by text; a numerical log feature vector generating step of generating a second feature vector on the basis of a numerical log output from the system and being a log expressed by a numerical value; a system feature vector generating step of generating a third feature vector on the basis of the first feature vector and the second feature vector; a learning step of learning a plurality of appearance values of the third feature vector and generating a model indicating a state of the system; and a determining step of determining the state of the system at determination target time on the basis of the third feature vector at the determination target time and the model.

An analysis apparatus comprises: a text log feature vector generator that generates a first feature vector on the basis of a text log output from a system and being a log expressed by text; a numerical log feature vector generator that generates a second feature vector on the basis of a numerical log output from the system and being a log expressed by a numerical value; a system feature vector generator that generates a third feature vector on the basis of the first feature vector and the second feature vector; a learning unit that learns a plurality of appearance values of the third feature vector and generates a model indicating a state of the system; and a determination unit that determines the state of the system at determination target time on the basis of the third feature vector at the determination target time and the model.

Advantageous Effects of Invention

According to the present invention, a system state can be comprehensively analyzed on the basis of both of a text log and a numerical log.

BRIEF DESCRIPTION OF DRAWINGS

FIG. 2 is a diagram for explaining an example when logs of a network apparatus are analyzed using the analysis apparatus in the first embodiment.

FIG. 3 is a diagram for explaining an example when logs of a machine tool are analyzed using the analysis apparatus in the first embodiment.

FIG. 7 is a diagram illustrating an example of a computer that implements the analysis apparatus by executing a program.

DESCRIPTION OF EMBODIMENTS

Hereinafter, embodiments of an analysis apparatus, an analysis method, and an analysis program according to the present application will be described in detail with reference to the drawings. It should be noted that the embodiments do not limit the present invention.

Configuration of First Embodiment

Figure 1:
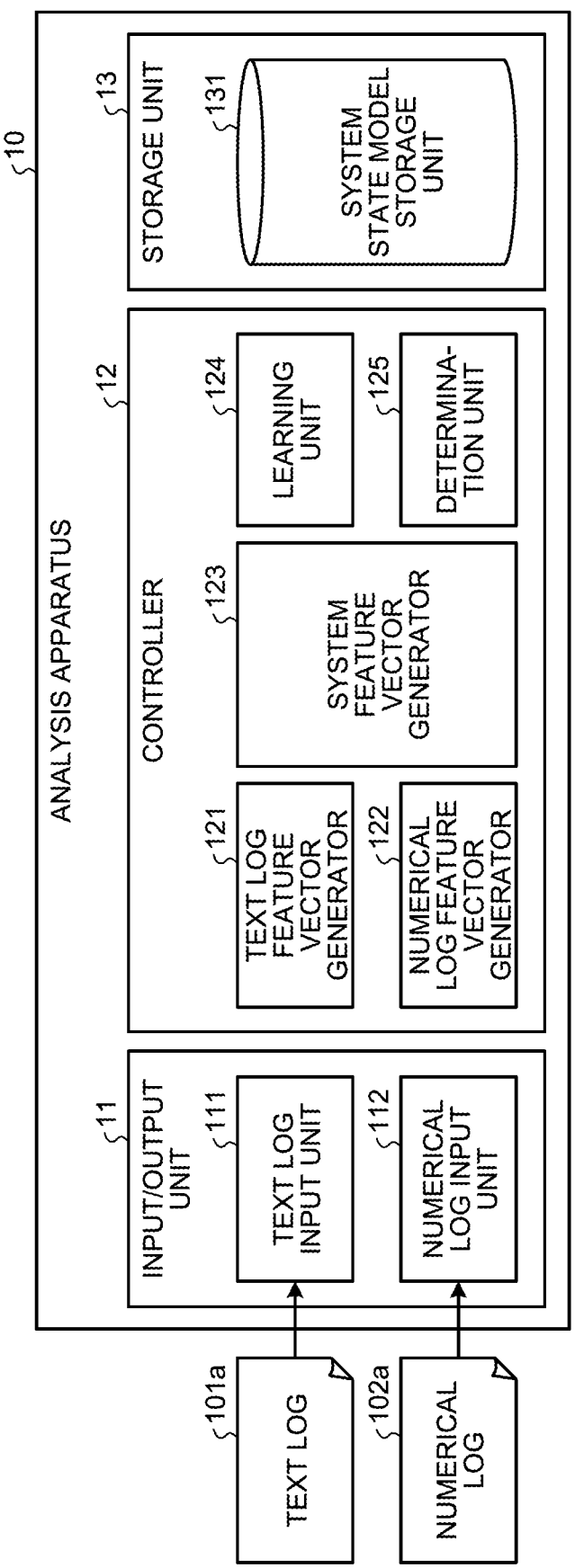
FIG. 1 is a diagram illustrating an example of the configuration of an analysis apparatus according to a first embodiment.

First, the configuration of an analysis apparatus according to a first embodiment will be described with reference to FIG. 1. FIG. 1 is a diagram illustrating an example of the configuration of the analysis apparatus in the first embodiment. As illustrated in FIG. 1, an analysis apparatus 10 includes an input/output unit 11, a controller 12, and a storage unit 13. The input/output unit 11 includes a text log input unit 111 and a numerical log input unit 112. The controller 12 includes a text log feature vector generator 121, a numerical log feature vector generator 122, a system feature vector generator 123, a learning unit 124, and a determination unit 125. The storage unit 13 includes a system state model storage unit 131.

As illustrated in FIG. 1, a text log 101a and a numerical log 102a output from a system as an analysis target are input to the analysis apparatus 10. It is sufficient that the system as the analysis target by the analysis apparatus 10 can acquire the text log and the numerical log. The system as the analysis target by the analysis apparatus 10 may be, for example, a calculator system configured by a server machine, a personal computer, a storage, and the like or a network configured by a router, a firewall, a load balancer, an optical transmission device, an optical transmission relay device, and the like. The system as the analysis target by the analysis apparatus 10 may be, for example, an environment in which the calculator system or the network system is virtualized.

The system as the analysis target by the analysis apparatus 10 may be a plant, a generator, a machine tool, a passenger machine such as a passenger car, an airplane, and a train, a small-sized electronic apparatus such as a household electric appliance, a mobile phone, and a smart phone, or a system configured by a living body such as human and an animal and a sensor apparatus measuring biological information of the living body.

The text log input unit 111 receives input of the text log 101a. Examples of the text log 101a include a syslog of an operating system (OS), execution logs of an application and a database, an error log, an operation log, MIB information provided from a network apparatus, an alert of a monitoring system, an action log, and an operation state log. The text log 101a may contain time information.

The numerical log input unit 112 receives input of the numerical log 102a. Examples of the numerical log 102a include pieces of performance information (a central processing unit (CPU) usage rate, a memory usage amount, a network transmission and reception data amount, a storage writing data amount and a storage reading data amount, and the like) capable of being acquired from the OS, and physical amounts that are acquired by sensors, such as an HDD rotating speed, a temperature, a humidity, an audio power spectrum, a heart rate, the number of steps, and gravity acceleration. The numerical log 102a may contain time information.

The text log feature vector generator 121 generates a first feature vector, that is, a text log feature vector on the basis of the text log 101a output from the system and being a log expressed by text. The numerical log feature vector generator 122 generates a second feature vector, that is, a numerical log feature vector on the basis of the numerical log 102a output from the system and being a log expressed by numerical values. The system feature vector generator 123 generates a third vector, that is, a system feature vector on the basis of the text log feature vector and the numerical log feature vector. In this case, the system feature vector generator 123 generates the system feature vector by joining the text log feature vector and the numerical log feature vector, for example.

The system feature vector generator 123 may generate the current system feature vector on the basis of the text log 101a and the numerical log 102a acquired moment by moment or may generate the past system feature vector based on the text log 101a and the numerical log 102a at a certain time point in the past. The current system feature vector is used for, for example, monitoring of a system state. The past system feature vector is used for, for example, analysis of the system state at the time point in the past and learning of a model.

The text log feature vector generator 121 can put, for example, all or some of the following pieces of information in the feature quantities of the text log feature vector.

Whether a log sequence that steadily appears in a normal state appears within a constant period of time Whether a log sequence that appears before occurrence of a specific anomaly highly possibly appears within a constant period of time The progress degree of the above-mentioned log sequence when the log sequence appears halfway Whether a log sequence that appears after occurrence of a specific anomaly highly possibly appears within a constant period of time The progress degree of the above-mentioned log sequence when the log sequence appears halfway Distribution of log types that have appeared within a constant period of time Likelihood based on the above-mentioned distribution The appearance frequency of a log type that has appeared within a constant period of time, the logarithm of the appearance frequency, and presence or absence of appearance The log sequence is appearance of predetermined messages in the predetermined order.

The numerical log feature vector generator 122 can put, for example, all or some of the following pieces of information in the feature quantities of the numerical log feature vector.

A measurement result numerical value itself

For a certain measurement numerical item, a value normalized to a mean of 0 and a standard deviation of 1 using a mean and a standard deviation derived from a large number of measurement result numerical values For a certain measurement numerical item, a value normalized to a maximum value to 1 and a minimum value to 0 (or −1) using a maximum value and a minimum value derived from a large number of measurement result numerical values A differential value itself between a prediction value calculated from a correlation among a plurality of measurement numerical items and an actual measurement result numerical value, the correlation being estimated by, for example, single regression or multiple regression Whether the above-mentioned differential value exceeds a certain range (for example, a range in which a value several times the standard deviation of the differential value is a threshold)

Whether measurement result numerical values for the respective measurement numerical items are within ranges of thresholds determined for the respective measurement numerical items A value calculated by specific calculation including addition, subtraction, multiplication, and division using the measurement numerical items An anomaly measure indicating divergence from a normal-state model generated by learning of the numerical log feature vectors in the normal state (for example, an anomaly measure with a local outlier factor (LOF) and Mahalanobis distance)

The learning unit 124 learns a plurality of appearance values of the system feature vectors to generate a system state model indicating a state of the system. The determination unit 125 determines the state of the system at the determination target time on the basis of the system feature vector at the determination target time and the system state model.

A machine learning technique can be used for learning of the feature vectors by the learning unit 124 and determination of the system state by the determination unit 125. The machine learning technique is a technique of generating a model from pieces of past data, determining or classifying an anomaly level of analysis target data, predicting a nearest observation value, and calculating an occurrence probability using the model and the analysis target data.

For example, as the machine learning technique of calculating the anomaly level for anomaly detection, a method using the anomaly level based on a density called LOF, a method using the Mahalanobis distance for the anomaly level, change detection using the time-series change degree as the anomaly level, and the like have been known.

As the machine learning technique of classification, algorithms such as perceptron, passive aggressive (PA), PA1, PA2, confidence weighted (CW), adaptive regularization of weight vectors (AROW), and normal herd (NHERD), a classification technique by weighing majority decision of pieces of neighborhood data, and the like have been known.

The PA and the like are described in, for example, Cited Document 1 (Koby Crammer, Ofer Dekel, Shai Shalev-Shwartz and Yoram Singer, Online Passive-Aggressive Algorithms, Proceedings of the Sixteenth Annual Conference on Neural Information Processing Systems (NIPS), 2003), Cited Document 2 (Koby Crammer and Yoram Singer. Ultraconservative online algorithms for multiclass problems. Journal of Machine Learning Research, 2003), and Cited Document 3 (Koby Crammer, Ofer Dekel, Joseph Keshet, Shai Shalev-Shwartz, Yoram Singer, Online Passive-Aggressive Algorithms. Journal of Machine Learning Research, 2006).

The CW is described in, for example, Cited Document 4 (Mark Dredze, Koby Crammer and Fernando Pereira, Confidence-Weighted Linear Classification, Proceedings of the 25th International Conference on Machine Learning (ICML), 2008), Cited Document 5 (Koby Crammer, Mark Dredze and Fernando Pereira, Exact Convex Confidence-Weighted Learning, Proceedings of the Twenty Second Annual Conference on Neural Information Processing Systems (NIPS), 2008), and Cited Document 6 (Koby Crammer, Mark Dredze and Alex Kulesza, Multi-Class Confidence Weighted Algorithms, Empirical Methods in Natural Language Processing (EMNLP), 2009).

The AROW is described in, for example, Cited Document 7 (Koby Crammer, Alex Kulesza and Mark Dredze, Adaptive Regularization Of Weight Vectors, Advances in Neural Information Processing Systems, 2009).

The NHERD is described in, for example, Cited Document 8 (Koby Crammer and Daniel D. Lee, Learning via Gaussian Herding, Neural Information Processing Systems (NIPS), 2010).

As the machine learning technique of predicting the nearest observation value, techniques of single regression, autoregression, and the like with time have been known. As the machine learning technique of calculating the occurrence probability for classification and anomaly detection, the Bayes estimation technique and the like have been known.

The determination of the system state by the determination unit 125 includes, for example, determination whether the system state is normal or anomalous and failure sign detection of detecting a sign state appearing before occurrence of a failure. The determination unit 125 may determine different states for respective causes of a failure in occurrence of the failure and estimate a failure cause on the basis of the determined different states.

The learning unit 124 may, for example, learn the system feature vectors in the normal state. In this case, the determination unit 125 determines normality or anomaly using an anomaly detection technique. The learning unit 124 may learn, for the normal state and a plurality of states after occurrence of the failure, the system feature vectors with labels of the respective states, for example. In this case, the determination unit 125 may estimate a state close to the state of the system feature vector as the analysis target using a classification technique, estimate a failure cause on the basis of a classification result, or estimate the state by calculating probabilities of the respective states by the Bayes estimation technique.

In the same manner, the learning unit 124 may learn, for states not after but before occurrence of a failure, the system feature vectors with labels of the respective states. In this case, the determination unit 125 can perform failure sign detection of whether the system state is close to a failure occurrence state on the basis of the system feature vector that is monitored all the time. The determination unit 125 can also estimate the system feature quantities soon after by time-series analysis (autoregression or the like) of the system feature vectors for a latest constant period of time and detect an anomaly on the basis of divergence between the estimation values and measurement values.

Hereinafter, specific examples when system states of various systems are analyzed using the analysis apparatus 10 will be described. The system as the analysis target by the analysis apparatus 10 is not limited to those, which will be described herein, and it is sufficient that the system can output the text log and the numerical log.

Example when Logs of Network Apparatus are Analyzed

First, an example when logs of a network apparatus are analyzed will be described with reference to FIG. 2. FIG. 2 is a diagram for explaining the example when the logs of the network apparatus are analyzed using the analysis apparatus in the first embodiment. As illustrated in FIG. 2, the system as the analysis target is configured by a network apparatus 30, a server 31, and a database 32.

The network apparatus 30 functions as both of a router and a firewall to relay and transfer TCP/IP communication between an external operation terminal and the server 31 and performs a firewall operation on the basis of previously set security settings. The network apparatus 30 appropriately records an operation condition in a syslog and acquires performance information. The syslog and the performance information are transferred to a collection apparatus 20.

The server 31 is, for example, an application server, and receives specific commands and pieces of data necessary for executing the commands and executes processing while appropriately referring to, updating, and so on, pieces of information in a database therein. The server 31 appropriately records an operation condition in an application log and acquires performance information. The application log and the performance information are transferred to the collection apparatus 20 through the network apparatus 30.

The database 32 stores, retrieves, changes, deletes, and so on, data on the basis of an operation from the server 31. The database 32 appropriately records an operation condition in a database log and acquires performance information. The database log and the performance information are transferred to the collection apparatus 20 through the network apparatus 30.

The collection apparatus 20 generates and saves one text log file 101b or one text log file 103b in which the syslog, the application log, the database log, and the like as the text logs acquired from the respective hosts (the network apparatus 30, the server 31, and the database 32) are aligned in time series. The text log file 101*b* includes, for example, the time, a host name, and a message.

In the same manner, the collection apparatus 20 generates and saves a numerical log file 102*b* or a numerical log file 104*b* in a CSV file format in which numerical values of the pieces of performance information as numerical logs acquired from the respective hosts are aligned in time series for the respective hosts and measurement items.

The analysis apparatus 10 receives, as inputs, the text log file 101*b* and the numerical log file 102*b* in a period A in the past in which the system state has been known, the text log file 101*b* and the numerical log file 102*b* having been collected by the collection apparatus 20, generates the system feature vector every occurrence time of each of a plurality of types of failure events (for example, fault of the database, application down, and fault of the network apparatus) that have occurred in the period A, and learns the system feature vectors together with failure type labels to generate a system state model.

In this case, the text log feature vector generator 121 generates the text log feature vector in the following manner, for example. First, the text log feature vector generator 121 converts respective log messages contained in the text log file 101*b* into individual log IDs correlated with respective meanings of messages other than parameter portions.

The text log feature vector generator 121 determines whether a log ID sequence as the previously set order of the log IDs appears in a latest constant time zone (for example, 1 hour). Then, the text log feature vector generator 121 sets, as a value of a predetermined feature quantity dimension in the text log feature vector, 1 when the log sequence appears and 0 when the log sequence does not appear.

The appearance of the log ID sequence is appearance of a log ID group forming the log ID sequence while ensuring the order thereof regardless of whether another log ID is interposed between the log IDs. For example, in the case in which a log ID sequence of (A, B, C) is set, when a log ID sequence of "DAHFBECGG" is provided in the corresponding time zone, A, B, and C appear in a second element, a fifth element, and a seventh element, respectively, in the order as set in the log ID sequence. It is therefore considered that the log ID sequence (A, B, C) appears.

Thus, the text log feature vector generator 121 may put, in the text log feature vector, a value indicating whether predetermined messages appear in the predetermined order in the text log.

The numerical log feature vector generator 122 generates the numerical log feature vector in the following manner, for example. First, the numerical log feature vector generator 122 forms a pair of an explanatory variable and a dependent variable from the items contained in the numerical log file 102*b*. The numerical log feature vector generator 122 calculates estimation values of numerical values for the item as the dependent variable of the pair from numerical values for the item as the explanatory variable of the pair using a correlation function that has been previously set to each pair.

The numerical log feature vector generator 122 calculates divergence values (residues) between the estimation values of the numerical values for the item as the dependent variable of the pair and actual values for the item to generate a numerical log feature vector using, as the feature quantity dimension, a maximum value of the divergence values in the latest constant time zone. The previously set correlation function may be formed by linear regression with the least squares method using the numerical logs in a period with no failure or may be determined as a correlation function that is supposed in design. The constant period during which the text log feature vector generator 121 determines the appearance of the log ID sequence and the constant period during which the numerical log feature vector generator 122 determines the maximum value may be the same as or different from each other.

As described above, the numerical log feature vector generator 122 may calculate an estimation value for a predetermined item included in the numerical log on the basis of a correlation between the predetermined item and an item other than the predetermined item that is included in the numerical log, and put, in the numerical log feature vector, a value indicating the divergence degree of an actual value for the predetermined item included in the numerical log from the estimation value.

The system feature vector generator 123 generates the system feature vector by joining the text log feature vector and the numerical log feature vector, for example. In this case, when the text log feature vector is an N-dimensional vector and the numerical log feature vector is an M-dimensional vector, the system feature vector is an (N+M)-dimensional vector.

The learning unit 124 learns the system feature quantities using the linear classification algorithm AROW, for example. To be specific, the learning unit 124 adds, to the system feature vector that has been generated from the log acquired when a failure has occurred among the system feature vectors in the period A, a failure type label of the failure that has occurred in the corresponding time zone for leaning, and adds a label "normal" to the system feature vectors generated from logs acquired in time zones other than the above-mentioned time zone among the system feature vectors in the period A for learning to generate the system state model.

When an unknown system state is analyzed using the system state model generated by the learning unit 124, an analyzer inputs, to the analysis apparatus 10, the text log file 103*b* and the numerical log file 104*b* in a period B to be analyzed and analyzes the system state in the period B.

In this case, the text log feature vector generator 121 generates the text log feature vector from the text log file 103*b*. Furthermore, the numerical log feature vector generator 122 generates the numerical log feature vector from the numerical log file 104*b*. The system feature vector generator 123 generates the system feature vector from the text log feature vector and the numerical log feature vector.

The determination unit 125 acquires the system feature vector and the system state model to determine the system state. In this case, the determination unit 125 estimates whether the system feature vector as the analysis target is close to either of "normal" or any of the failure types using the linear classification algorithm AROW and sets the state that has been estimated to be the closest to the state of the system feature vector as the estimation value of the system state.

In this manner, the learning unit 124 may learn, for the respective different states, the system feature vectors when the system state is known and the system states in a correlated manner and generate the system state model representing relations between the respective different states and the system feature vectors. In this case, the determination unit 125 determines, using the system state model, the state that is estimated to be the closest to the system feature vector at the determination target time as the system state at the determination target time.

The analyzer can thereby grasp a failure close to the system state in the period B and assist estimation of a cause of the failure, thereby executing an efficient failure cause analysis operation.

Example when Logs of Machine Tool are Analyzed

Next, an example when logs of a machine tool are analyzed will be described with reference to FIG. 3. FIG. 3 is a diagram for explaining an example when the logs of the machine tool are analyzed using the analysis apparatus in the first embodiment. As illustrated in FIG. 3, the system as the analysis target is a machine tool 40.

The machine tool 40 is a welding robot having one welder installed on a multi-articulated movable arm. The machine tool 40 records, as an operation log being the text log, executed operations such as execution of rotation of the respective joints and welding together with the operation execution time. The machine tool 40 records, as a performance log being the numerical log, measured values for measurement items (welding temperature, arm rotating speed, arm torque, and the like) capable of being acquired by attached sensors every minute. The operation log and the performance log are transferred to the collection apparatus 20.

The collection apparatus 20 saves the operation log acquired from the machine tool 40 as a text log file 101c or a text log file 103c. The collection apparatus 20 generates and saves a numerical log file 102c or a numerical log file 104c in a CSV file format in which numerical values of the performance log acquired from the machine tool 40 are aligned in time series for the respective measurement items.

The analysis apparatus 10 receives, as inputs, the text log file 101c and the numerical log file 102c in a period A in the past in which the system state has been known, the text log file 101c and the numerical log file 102c having been collected by the collection apparatus 20, learns, as normal data, the system feature vector at the time at which the machine tool 40 has normally operated in the period A, and learns, as sign data, the system feature vector at the time determined to be in a failure precursory period with a small-scale anomaly that has occurred before occurrence of the failure to thereby generate a system state model.

In this case, the text log feature vector generator 121 determines whether all or some of a plurality of previously set operation procedures (log sequence) are included in a range of the constant number of latest processes (for example, five processes) in the text log file 101c and sets a progress rate indicating the progress degree of the operation procedures as a value of the feature quantity dimension in the text log feature vector.

To be specific, for example, in the case in which operation procedures of (A, B, C, D) are set, when a log sequence of "GEABC" is provided in a range of the corresponding time zone in the text log file 101c, the text log feature vector generator 121 sets a value of "75%" as the value of the feature quantity dimension in the text log feature vector because three processes of the four processes in total are completed as the progress condition of the operation procedures.

Furthermore, the numerical log feature vector generator 122 generates a numerical log feature vector using, as the feature quantity dimension, an average value of values for all of the measurement items in a range of the constant number of latest processes in the numerical log file 102c. The constant number of processes for which the text log feature vector generator 121 determines the operation procedures and the constant number of processes for which the numerical log feature vector generator 122 calculates the average value may be the same as or different from each other.

The system feature vector generator 123 generates the system feature vector by joining the text log feature vector and the numerical log feature vector, for example. In this case, when the text log feature vector is an N-dimensional vector and the numerical log feature vector is an M-dimensional vector, the system feature vector is an (N+M)-dimensional vector.

The learning unit 124 learns the system feature quantities using the Bayes estimation algorithm, for example. To be specific, the learning unit 124 divides the respective feature quantity dimensions into categories having a plurality of value ranges for the system feature vectors in the period A and calculates frequency distributions of the respective categories from measurement values of the respective feature quantity dimensions for the input normal data and the input sign data to thereby generate the system state model.

When system failure sign detection is performed using the system state model generated by the learning unit 124, an analyzer inputs, to the analysis apparatus 10, the text log file 103c and the numerical log file 104c for the constant number of processes in a period B to be analyzed and analyzes the system state in the period B.

In this case, the text log feature vector generator 121 generates the text log feature vector from the text log file 103c. Furthermore, the numerical log feature vector generator 122 generates the numerical log feature vector from the numerical log file 104c. The system feature vector generator 123 generates the system feature vector from the text log feature vector and the numerical log feature vector.

The determination unit 125 acquires the system feature vector and the system state model to determine the system state. In this case, the determination unit 125 calculates the probability that the system feature vector as the analysis target is the sign data using the Bayes estimation algorithm and sets the probability as the estimation value of the system state.

The analyzer can thereby grasp the degree that the latest system state is close to a state causing the failure to occur. When the system state is close to the state causing the failure to occur to some extent, the analyzer performs a preventive conservation operation to prevent the failure before occurrence, thereby executing efficient operation.

As described above, the determination unit 125 can estimate the system feature quantities soon after by time-series analysis of the system feature vectors for a constant period of time and detect an anomaly on the basis of divergence between the estimation values and measurement values. The determination unit 125 can therefore estimate the system feature quantities at the predetermined time on the basis of the system state model generated from the system feature vectors in the period A and the system feature vectors in the period A to determine whether the state at the predetermined time is anomalous on the basis of divergence between the estimation values and measurement values.

That is to say, the learning unit 124 learns the system feature vectors for the predetermined period of time to thereby generate the system state model representing the time-series tendency of the system feature vectors. In this case, the determination unit 125 calculates the estimation values of the system feature vector at the determination target time on the basis of the model representing the time-series tendency and values of the system feature vectors before the determination target time to thereby determine the system state at the determination target time on the basis of the divergence degree of the actual values of the system feature vector at the determination target time from the estimation values.

Example when Logs of Wearable Terminal are Analyzed

Figure 4:
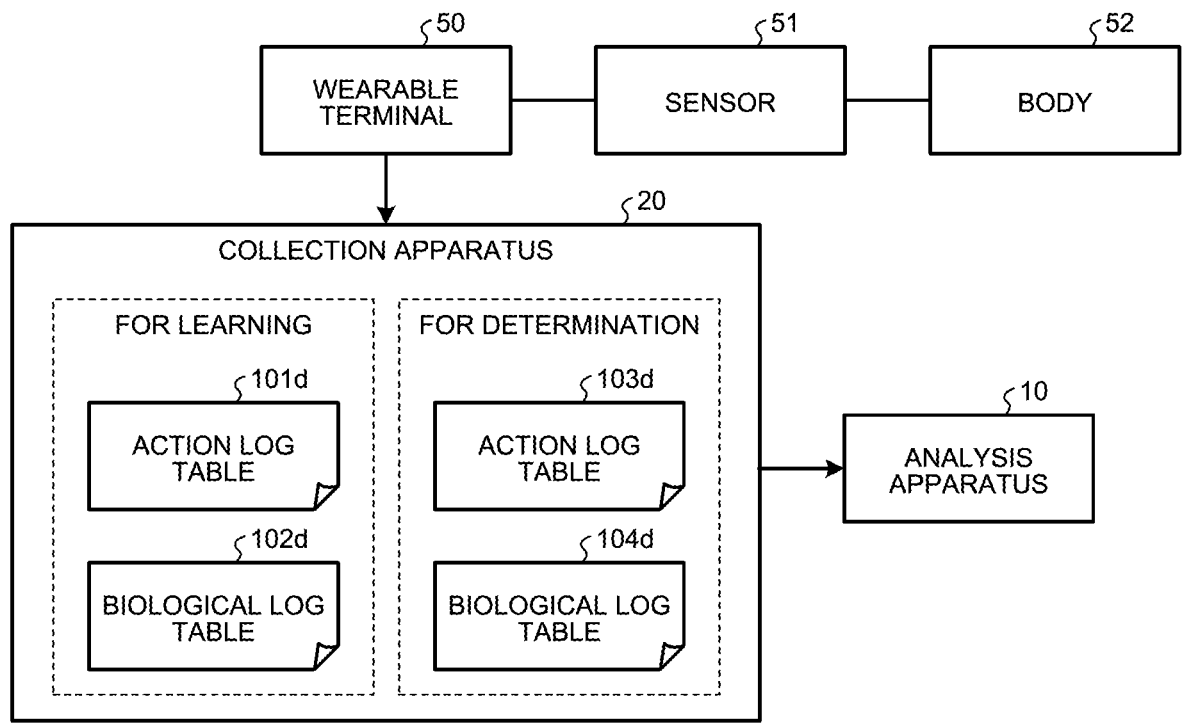
FIG. 4 is a diagram for explaining an example when logs of a wearable terminal are analyzed using the analysis apparatus in the first embodiment.

Next, an example when logs of a wearable terminal are analyzed will be described with reference to FIG. 4. FIG. 4 is a diagram for explaining the example when the logs of the wearable terminal are analyzed using the analysis apparatus in the first embodiment. As illustrated in FIG. 4, the system as the analysis target is configured by a wearable terminal 50 and a sensor 51 installed on a body 52 of a user.

The wearable terminal 50 records, as an action log being the text log, an action type (walking, running, being still (upright position), being still (sitting position), jumping, dining, sleeping, or the like) executed at each time by user input. The wearable terminal 50 records, as a biological log being the numerical log, biological measurement data (heart rate, the number of steps, three-axis acceleration, or the like) provided from the sensor 51 that has made contact with the body 52. The action log and the biological log are transferred to the collection apparatus 20.

The collection apparatus 20 saves the action log and the biological log as database tables. The collection apparatus 20 adds the action log acquired from the wearable terminal 50 to an action log table 101d or an action log table 103d. The collection apparatus 20 adds the biological log acquired from the wearable terminal 50 to a biological log table 102d or 104d.

The analysis apparatus 10 receives, as inputs, the action log table 101d and the biological log table 102d in a period A in the past in which the system state has been normal, the action log table 101d and the biological log table 102d having been collected by the collection apparatus 20, and learns system feature vectors to thereby generate a system state model in a normal state.

In this case, the text log feature vector generator 121 sets, as a value of a feature quantity dimension in a text log feature vector, the number of times of appearance of a previously set sequence of the action types (order of action types) in a latest constant period of time (for example, one day) in the action log table 101d.

The appearance of the action type sequence indicates appearance of a series of action type sequence with no another action type interposed between the action types in the action log. For example, it is assumed that in the case in which an action type sequence of (A, B, C) is set, an action type sequence of "DABEABCGGABCD" is provided in the corresponding time zone. In this case, the text log feature vector generator 121 sets the number of times of 2 as the value of the feature quantity dimension corresponding to (A, B, C) because the action type sequence of (A, B, C) is contained twice in a portion from a fifth element to a seventh element and a portion from a tenth element to a twelfth element.

The numerical log feature vector generator 122 uses pieces of biological data for a latest constant period of time (for example, to previous measurement from measurement ten times before) for respective measurement items to generate latest time-series models related to the measurement items. The numerical log feature vector generator 122 calculates estimation values of values to be provided in this measurement using the time-series models and sets divergence values between the estimation values and actually provided measurement values as values of feature quantity dimensions in a numerical log feature vector that correspond to the respective measurement items. The numerical log feature vector generator 122 generates the time-series models using a method such as time-series regression analysis with autoregression, for example.

The system feature vector generator 123 generates the system feature vector by joining the text log feature vector and the numerical log feature vector, for example. In this case, when the text log feature vector is an N-dimensional vector and the numerical log feature vector is an M-dimensional vector, the system feature vector is an (N+M)-dimensional vector. The system feature vector can be made to be an (N+M+L)-dimensional vector by forming and joining L feature quantity dimensions processed by addition, subtraction, multiplication and division and logical operation of predetermined elements in the text log feature vector and predetermined elements in numerical log feature vector.

The learning unit 124 learns the system feature quantities using the LOF algorithm, for example. When the LOF algorithm is used, the learning unit 124 calculates an anomaly measure indicating the divergence degree of the system feature vector as the analysis target from a system feature vector group registered in the past. To be specific, the learning unit 124 calculates the anomaly measure by comparing the densities of the feature vectors registered in the past in the neighborhood of the system feature vector as the analysis target and the densities of the more neighbor feature vectors registered in the past in the system feature vector group in the neighborhood.

In this case, the learning unit 124 registers the system feature vectors in the normal period A, calculates a threshold enabling the top constant percentages (for example, 1%) and others to be identified for the anomaly measures when all of the system feature vectors are set as the analysis targets, and generates the system state model in the normal state that contains the registered system feature vector group and the threshold.

When the analysis apparatus 10 is caused to function as a physical condition anomaly detection system, the determination unit 125 monitors piece of latest data that are added to the action log table 103d and the biological log table 104d all the time, acquires the action log data and the biological log data from the pieces of latest added data, and analyzes the current physical condition of the user.

In this case, the text log feature vector generator 121 generates the text log feature vector on the basis of the action log data acquired from the added data in the action log table 103d. The numerical log feature vector generator 122 generates the numerical log feature vector on the basis of the biological log data acquired from the added data in the biological log table 104d. The system feature vector generator 123 generates the system feature vector from the text log feature vector and the numerical log feature vector.

The determination unit 125 acquires the system feature vector and the system state model in the normal state to determine the system state. In this case, the determination unit 125 calculates the anomaly measure of the system feature vector as the analysis target using the LOF algorithm and determines whether the system state is anomalous by determining whether the anomaly measure exceeds the threshold contained in the system state model in the normal state.

Thus, the learning unit 124 may learn the system feature vectors when the system state is normal to generate the system state model. In this case, the determination unit 125 determines the system state at the determination target time on the basis of the divergence degree of the system feature vector at the determination target time from the system feature vectors when the system state is normal that are represented by the system state model.

As described above, whether the current health condition is anomalous in comparison with the pieces of normal data registered in past can be analyzed by causing the analysis apparatus 10 to function as the physical condition anomaly detection system. Furthermore, when the current health condition is anomalous, warning to the user and alarm communication to a user's doctor can be made, so that physical condition management can be achieved by urging the user to receive medical check-up before a severe condition and so on.

Processing in First Embodiment

Figure 5:
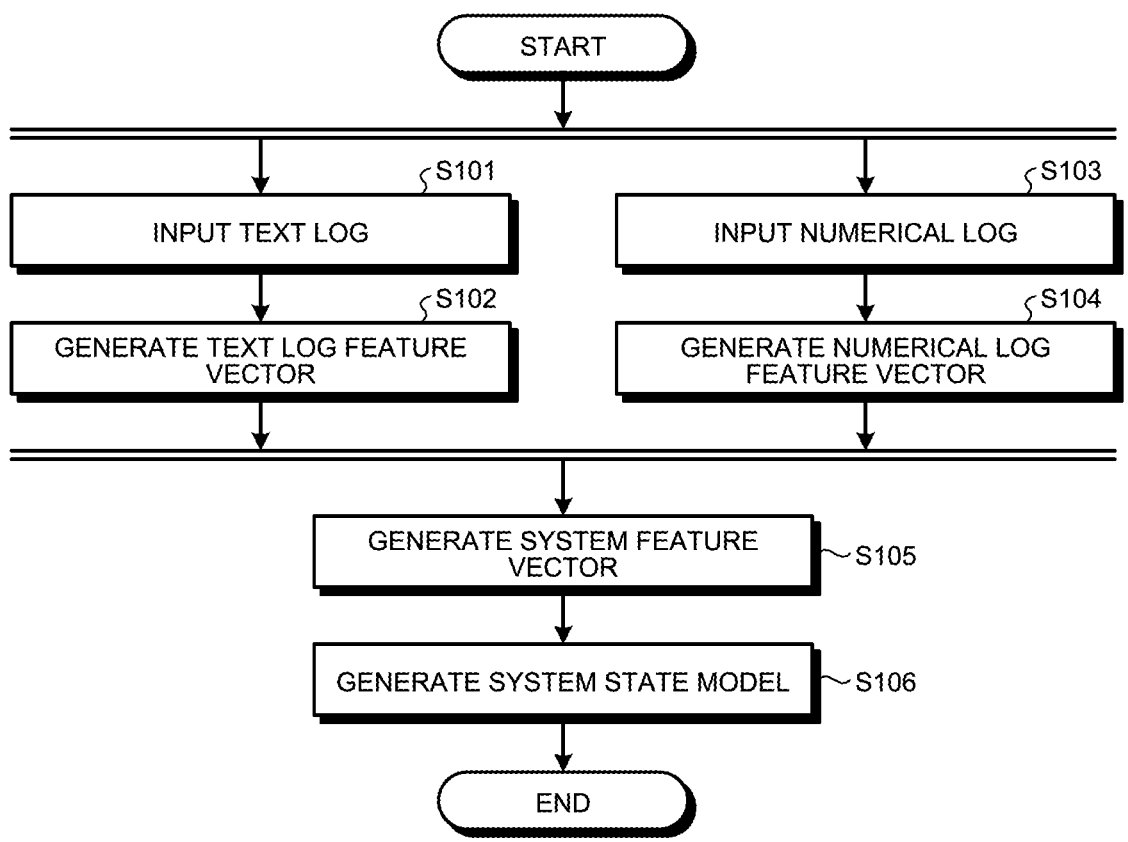
FIG. 5 is a flowchart illustrating flow of learning processing by the analysis apparatus in the first embodiment.

Flow of learning processing by the analysis apparatus in the first embodiment will be described with reference to FIG. 5. FIG. 5 is a flowchart illustrating the flow of the learning processing by the analysis apparatus in the first embodiment. As illustrated in FIG. 5, first, the text log input unit 111 receives input of a text log (step S101). The text log feature vector generator 121 generates a text log feature vector on the basis of the text log (step S102).

The numerical log input unit 112 receives input of a numerical log (step S103). The numerical log feature vector generator 122 generates a numerical log feature vector on the basis of the numerical log (step S104). Step S103 and step S104 may be performed prior to step S101 and step S102.

The system feature vector generator 123 generates a system feature vector on the basis of the text log feature vector and the numerical log feature vector (step S105). The learning unit 124 learns the system feature vectors to generate a system state model (step S106).

Figure 6:
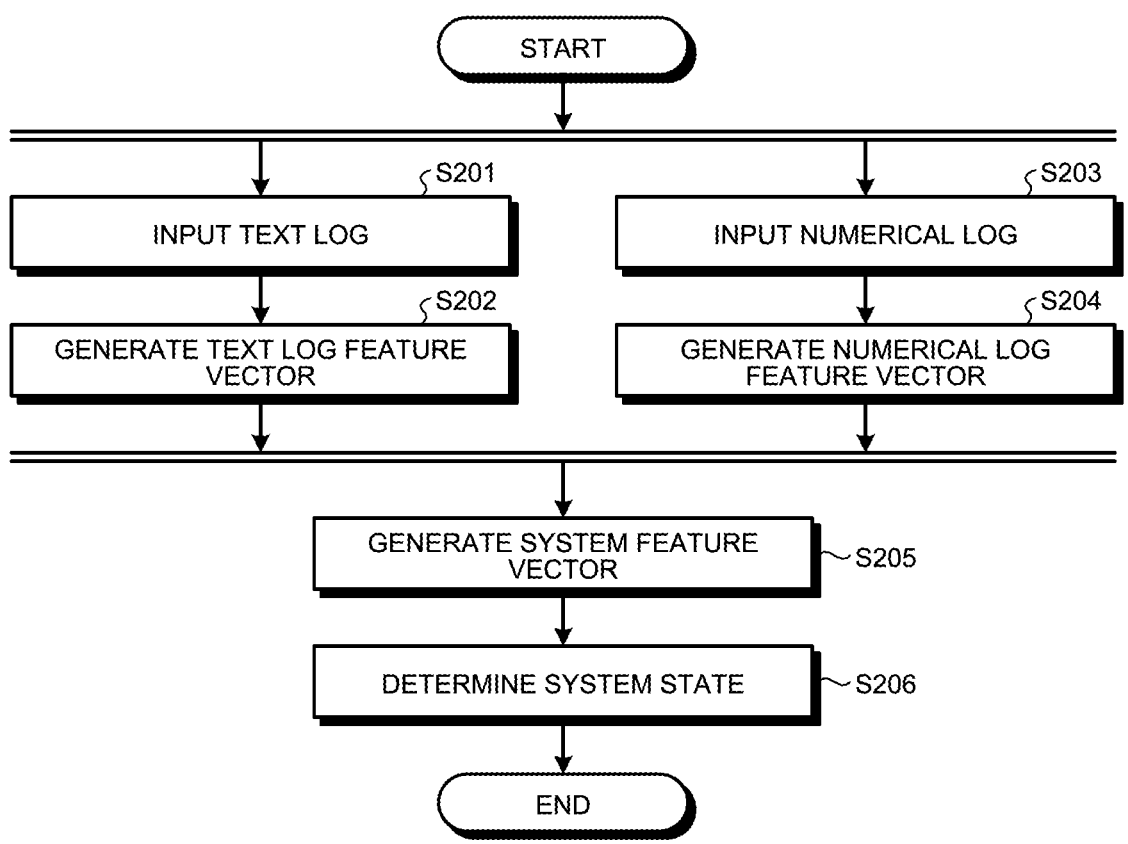
FIG. 6 is a flowchart illustrating flow of determination processing by the analysis apparatus in the first embodiment.

Flow of determination processing by the analysis apparatus in the first embodiment will be described with reference to FIG. 6. FIG. 6 is a flowchart illustrating the flow of the determination processing by the analysis apparatus in the first embodiment. As illustrated in FIG. 6, first, the text log input unit 111 receives input of a text log (step S201). The text log feature vector generator 121 generates a text log feature vector on the basis of the text log (step S202).

The numerical log input unit 112 receives input of a numerical log (step S203). The numerical log feature vector generator 122 generates a numerical log feature vector on the basis of the numerical log (step S204). Step S203 and step S204 may be performed prior to step S201 and step S202.

The system feature vector generator 123 generates a system feature vector on the basis of the text log feature vector and the numerical log feature vector (step S205). The determination unit 125 determines a system state on the basis of the system feature vector and the system state model (step S206).

Effects of First Embodiment

The text log feature vector generator 121 generates a first feature vector, that is, a text log feature vector on the basis of a text log output from a system and being a log expressed by text. The numerical log feature vector generator 122 generates a second feature vector, that is, a numerical log feature vector on the basis of a numerical log output from the system and being a log expressed by numerical values. The system feature vector generator 123 generates a third vector, that is, a system feature vector on the basis of the text log feature vector and the numerical log feature vector. The learning unit 124 learns a plurality of appearance values of the system feature vectors to generate a system state model indicating a state of the system. The determination unit 125 determines the state of the system at the determination target time on the basis of the system feature vector at the determination target time and the system state model.

Thus, the system state can be comprehensively analyzed on the basis of both of the text log and the numerical log by performing analysis using the system feature vector to which both of pieces of information of the text log and the numerical log have been reflected.

Feature indicating the system state can appear in only one of the text log and the numerical log. The embodiment can analyze the system state even in this case with high accuracy.

The text log feature vector generator 121 may put, in the text log feature vector, a value indicating whether predetermined messages appear in the predetermined order in the text log. One feature quantity can therefore express many pieces of information including message types and the alignment order thereof.

The numerical log feature vector generator 122 may calculate an estimation value for a predetermined item included in the numerical log on the basis of a correlation between the predetermined item and an item other than the predetermined item that is included in the numerical log, and put, in the numerical log feature vector, a value indicating the divergence degree of an actual value for the predetermined item included in the numerical log from the estimation value. Even when the measurement value deviating from past data is provided, for example, the measurement value is not determined to be an anomalous value as long as the divergence degree from the estimation value based on the correlation is within an allowable range. The possibility that a normal value is determined to be an anomalous value in the analysis process can therefore be reduced.

The learning unit 124 may learn, for the respective different states, the system feature vectors when the system state is known and the system states in a correlated manner, and generate a system state model representing relations between the respective different states and the system feature vectors. In this case, the determination unit 125 estimates the system state that is the closest to the system feature vector at the determination target time using the system state model and determines it as the state of the system at the determination target time. The state close to the system state at the determination target time can therefore be grasped. Accordingly, learning of the system states after occurrence of failures in the past while adding labels for respective failure causes thereto enables a cause of a failure that has newly occurred to be efficiently estimated. Furthermore, learning of the system states before occurrence of failures in the past as failure sign states enables failures to be prevented before occurrence by determining whether the current state is the sign state close to the state causing the failure to occur and using the information for the failure sign detection.

The learning unit 124 may learn the system feature vectors for a predetermined period of time to thereby generate the system state model representing time-series tendency of the system feature vectors. In this case, the determination unit 125 calculates the estimation values of the system feature vector at the determination target time on the basis of the model representing the time-series tendency and values of the system feature vectors before the determination target time to thereby determine the system state at the determination target time on the basis of the divergence degree of the actual values of the system feature vector at the determination target time from the estimation values. With this configuration, the divergence degree of the system state at the determination target time from the normal state can be grasped, and used for system monitoring.

The learning unit 124 may learn the system feature vectors when the system state is the normal state to generate the system state model. In this case, the determination unit 125 determines the system state at the determination target time on the basis of the divergence degree of the system feature vector at the determination target time from the system feature vectors when the system state is normal that are represented by the system state model. With this configuration, the divergence degree of the system state at the determination target time from the normal state can be grasped, and countermeasures can be taken in advance against an anomalous state.

Other Embodiments

In the first embodiment, the system feature vector generator 123 generates the system feature vector by joining the text log feature vector and the numerical log feature vector. A method of generating the system feature vector by the system feature vector generator 123 is, however, not limited to joint of the text log feature vector and the numerical log feature vector, for example.

System Configuration and Others

The respective components of the respective apparatuses illustrated in the drawings are conceptual and are not necessarily required to be configured as illustrated therein physically. That is to say, specific forms of distribution and integration of the respective apparatuses are not limited to those illustrated in the drawings, and all or some of them can be configured to be distributed or integrated functionally or physically based on a desired unit depending on various loads, usage conditions, and the like. Furthermore, all or some of the respective processing functions that are executed in the respective apparatuses may be implemented by a central processing unit (CPU) and a program to be analyzed and executed by the CPU or may be implemented as hardware by wired logic.

All or some of the pieces of processing that have been described to be performed automatically among the pieces of processing described in the embodiments can be performed manually. Alternatively, all or some of the pieces of processing that have been described to be performed manually among the pieces of processing described in the embodiments can be performed automatically by a known method. In addition, pieces of information including processing procedures, control procedures, specific names, and pieces of data of various types and parameters described in the above-described document and drawings can be changed as appropriate unless otherwise specified.

Program

As one embodiment, the analysis apparatus can be implemented by installing, as package software or on-line software, an analysis program executing the above-mentioned learning and determination into a desired computer. For example, an information processing apparatus can be made to function as the analysis apparatus by causing the information processing apparatus to execute the above-mentioned analysis program. The information processing apparatus referred to herein includes server machines and desktop-type and notebook-type personal computers. In addition, the information processing apparatus includes mobile communication terminals such as smart phones, cellular phones, and personal handyphone systems (PHSs) and slate terminals such as personal digital assistants (PDAs).

The analysis apparatus can also be mounted as a server apparatus providing service related to the above-mentioned learning and determination to a client being a terminal device that a user uses. For example, the analysis apparatus is mounted as a server apparatus providing analysis service receiving, as inputs, the text log and the numerical log and outputting the system feature model and a determination result of the system state. In this case, the analysis apparatus may be mounted as a Web server or may be mounted as a cloud providing service related to the above-mentioned analysis by outsourcing.

FIG. 7 is a diagram illustrating an example of a computer that implements the analysis apparatus by executing a program. A computer 1000 includes, for example, a memory 1010 and a CPU 1020. The computer 1000 includes a hard disk drive interface 1030, a disk drive interface 1040, a serial port interface 1050, a video adapter 1060, and a network interface 1070. The respective units are connected to one another via a bus 1080.

The memory 1010 includes a read only memory (ROM) 1011 and a random access memory (RAM) 1012. The ROM 1011 stores therein, for example, a boot program such as a basic input output system (BIOS). The hard disk drive interface 1030 is connected to a hard disk drive 1090. The disk drive interface 1040 is connected to a disk drive 1100. For example, a detachable storage medium such as a magnetic disk and an optical disk is inserted into the disk drive 1100. The serial port interface 1050 is connected to, for example, a mouse 1110 and a keyboard 1120. The video adapter 1060 is connected to, for example, a display 1130.

The hard disk drive 1090 stores therein, for example, an operating system (OS) 1091, an application program 1092, a program module 1093, and program data 1094. That is to say, the program defining the respective pieces of processing of the analysis apparatus is mounted as the program module 1093 in which a computer-executable code has been described. The program module 1093 is stored in, for example, the hard disk drive 1090. The program module 1093 for executing the same pieces of processing as those of the functional components of the analysis apparatus is stored in, for example, the hard disk drive 1090. The hard disk drive 1090 may be replaced by a solid state drive (SSD).

The pieces of setting data that are used in the pieces of processing in the above-mentioned embodiment are stored, as the program data 1094, in, for example, the memory 1010 and the hard disk drive 1090. The CPU 1020 reads and executes the program module 1093 and the program data 1094 stored in the memory 1010 and the hard disk drive 1090 on the RAM 1012 if necessary.

The program module 1093 and the program data 1094 are not limited to be stored in the hard disk drive 1090 and may be stored in, for example, a detachable storage medium and read by the CPU 1020 through the disk drive 1100 or the like. Alternatively, the program module 1093 and the program data 1094 may be stored in another computer connected through a network (local area network (LAN), wide area network (WAN), or the like). The program module 1093 and the program data 1094 may be read from another computer by the CPU 1020 through the network interface 1070.

REFERENCE SIGNS LIST

10 ANALYSIS APPARATUS
11 INPUT/OUTPUT UNIT
12 CONTROLLER
13 STORAGE UNIT
20 COLLECTION APPARATUS
30 NETWORK APPARATUS

31 SERVER
32 DATABASE
40 MACHINE TOOL
50 WEARABLE TERMINAL
51 SENSOR
52 BODY
101*a* TEXT LOG
102*a* NUMERICAL VALUE LOG
101*b*, 101*c*, 103*b*, 103*c* TEXT LOG FILE
102*b*, 102*c*, 104*b*, 104*c* NUMERICAL VALUE LOG FILE
101*d*, 103*d* ACTION LOG TABLE
102*d*, 104*d* BIOLOGICAL LOG TABLE
111 TEXT LOG INPUT UNIT
112 NUMERICAL VALUE LOG INPUT UNIT
121 TEXT LOG FEATURE VECTOR GENERATOR
122 NUMERICAL LOG FEATURE VECTOR GENERATOR
123 SYSTEM FEATURE VECTOR GENERATOR
124 LEARNING UNIT
125 DETERMINATION UNIT
131 SYSTEM STATE MODEL STORAGE UNIT

The invention claimed is:

1. An analysis apparatus comprising:
processing circuitry programmed to execute a process comprising:
generating a first feature vector on the basis of a text log output from a system and being a log expressed by text;
generating a second feature vector on the basis of a numerical log output from the system and being a log expressed by a numerical value;
generating a third feature vector on the basis of the first feature vector and the second feature vector;
learning a plurality of appearance values of the third feature vector and generating a model indicating a state of the system; and
determining the state of the system at determination target time on the basis of the third feature vector at the determination target time and the model.

2. The analysis apparatus according to claim 1, wherein the generating the first feature vector puts, in the first feature vector, a value indicating whether predetermined messages appear in a predetermined order in the text log.

3. The analysis apparatus according to claim 1, wherein the generating the second feature vector calculates an estimation value for a predetermined item included in the numerical log on the basis of a correlation between the predetermined item and an item other than the predetermined item that is included in the numerical log, and puts, in the second feature vector, a value indicating a divergence degree of an actual value for the predetermined item included in the numerical log from the estimation value.

4. The analysis apparatus according to claim 1, wherein
the generating the first feature vector puts, in the first feature vector, a value indicating whether predetermined messages appear in a predetermined order in the text log; and
the generating the second feature vector calculates an estimation value for a predetermined item included in the numerical log on the basis of a correlation between the predetermined item and an item other than the predetermined item that is included in the numerical log, and puts, in the second feature vector, a value indicating a divergence degree of an actual value for the predetermined item included in the numerical log from the estimation value.

5. The analysis apparatus according to claim 1, wherein
the learning learns, for a plurality of different states, the third feature vectors when the state of the system is known and the states of the system in a correlated manner and generates a model indicating a relation between the different states and the third feature vectors, and
the determining determines, using the model, the state at the determination target time by calculating the state close to the third feature vector at the determination target time among the different states of the system.

6. The analysis apparatus according to claim 1, wherein
the learning learns the third feature vectors for a predetermined period of time to generate the model indicating a time-series tendency of the third feature vectors, and
the determining calculates an estimation value of the third feature vector at the determination target time on the basis of the model representing the time-series tendency and values of the third feature vectors before the determination target time and determines the state of the system at the determination target time on the basis of a divergence degree of actual values of the third feature vector at the determination target time from the estimation value.

7. The analysis apparatus according to claim, 1, wherein
the learning learns the third feature vectors when the state of the system is normal to generate the model, and
the determining determines the state of the system at the determination target time on the basis of a divergence degree of the third feature vector at the determination target time from the third feature vectors when the state of the system is normal that is represented by the model.

8. An analysis method that is executed by an analysis apparatus, the analysis method comprising:
a text log feature vector generating step of generating a first feature vector on the basis of a text log output from a system and being a log expressed by text;
a numerical log feature vector generating step of generating a second feature vector on the basis of a numerical log output from the system and being a log expressed by a numerical value;
a system feature vector generating step of generating a third feature vector on the basis of the first feature vector and the second feature vector;
a learning step of learning a plurality of appearance values of the third feature vector and generating a model indicating a state of the system; and
a determining step of determining the state of the system at determination target time on the basis of the third feature vector at the determination target time and the model.

9. A non-transitory computer-readable recording medium having stored a program for analysis that causes a computer to execute a process comprising:
generating a first feature vector on the basis of a text log output from a system and being a log expressed by text;
generating a second feature vector on the basis of a numerical log output from the system and being a log expressed by a numerical value;
generating a third feature vector on the basis of the first feature vector and the second feature vector;
learning a plurality of appearance values of the third feature vector and generates a model indicating a state of the system; and determining the state of the system at determination target time on the basis of the third feature vector at the determination target time and the model.

\* \* \* \* \*